US009817073B2

(12) United States Patent
Klein et al.

(10) Patent No.: US 9,817,073 B2
(45) Date of Patent: Nov. 14, 2017

(54) SWITCHING STATUS CHECK WITH CIRCUIT PARTS OF AN INSULATION MONITOR

(71) Applicant: Hella KGaA Hueck & Co., Lippstadt (DE)

(72) Inventors: Daniel Klein, Lippstadt (DE); Georg Nau, Erwitte (DE); Benjamin Schoening, Lippstadt (DE)

(73) Assignee: Hella KGaA Hueck & Co., Lippstadt (DE)

( * ) Notice: Subject to any disclaimer, the term of this patent is extended or adjusted under 35 U.S.C. 154(b) by 147 days.

(21) Appl. No.: 14/876,371

(22) Filed: Oct. 6, 2015

(65) Prior Publication Data

US 2016/0154064 A1   Jun. 2, 2016

(30) Foreign Application Priority Data

Nov. 27, 2014  (DE) .................. 10 2014 117 417

(51) Int. Cl.
*G01R 31/327* (2006.01)
*G01R 31/00* (2006.01)

(52) U.S. Cl.
CPC ........ *G01R 31/3277* (2013.01); *G01R 31/006* (2013.01)

(58) Field of Classification Search
CPC ....... H02B 13/065; H02H 3/04; G01R 31/327
See application file for complete search history.

(56) References Cited

U.S. PATENT DOCUMENTS

2011/0115527 A1* 5/2011 Quinones ............... H03K 17/18
    327/77
2014/0028322 A1* 1/2014 Tzivanopoulos .. G01R 31/3606
    324/433

FOREIGN PATENT DOCUMENTS

DE       103 04 234        1/2003
DE         10304234   *    5/2004
DE    10 2006 050 529     10/2006
DE    10 2013 104 629      5/2013

* cited by examiner

*Primary Examiner* — Drew A Dunn
*Assistant Examiner* — Sailesh Thapa
(74) *Attorney, Agent, or Firm* — Husch Blackwell LLP

(57) ABSTRACT

A battery management system for a high-voltage battery that has a switching device with controllable switching elements for establishing and disconnecting an electrical connection between the poles of the high-voltage battery and the connection points for a consumer network, and a device for insulation monitoring. The poles and connection points are each switched to a reference potential for insulation measurement via a voltage divider. The battery management system may have a device for checking the switching status of the controllable switching elements by means of measuring devices for determining the electrical voltage. The measuring devices are arranged so that they measure the voltage between the output of the respective voltage divider and the reference potential. The device for checking the switching status of the controllable switching elements has a device for comparing the measured voltage values of the two measuring devices. A controllable switching element is switched between each of their assigned voltage dividers.

8 Claims, 1 Drawing Sheet

SWITCHING STATUS CHECK WITH CIRCUIT PARTS OF AN INSULATION MONITOR

CROSS REFERENCE

This application claims priority to German Application No. 10 2014 117417.8, filed Nov. 27, 2014, the entirety of which is hereby incorporated by reference.

FIELD OF TECHNOLOGY

The invention concerns a battery management system for high-voltage batteries that is used primarily in electric and hybrid vehicles.

BACKGROUND

The known state of the art has battery management systems that connect a high-voltage battery to a consumer network via two contactors. Depending on the switching status of the contactor activator, either the high-voltage battery is connected to the consumer network or both poles are disconnected from the consumer network.

This function is for the sake of safety, to de-energize the consumer network downstream of the battery in the event of a fault. Thus the ability of the contactors to function properly is relevant to safety and must be monitored. Therefore it is necessary to check whether the contactor contacts actually close after the request for an electrical connection, and whether they actually open after the request for a disconnection.

A disadvantage of the state of the art is that components with considerable space requirements are needed to check the contactor contacts. Checking the contactor contacts necessitates voltage measurements, which are done across voltage dividers due to the high voltages. Accordingly, the voltage dividers must be laid out over a large area due to the required insulation spacing.

SUMMARY OF THE INVENTION

The task of the present invention is to overcome the disadvantages in the state of the art.

A solution for solving this task includes a battery management system for a high-voltage battery that has:
a switching device with controllable switching elements for establishing and disconnecting the electrical connection between the poles of the high-voltage battery and the connection points for a consumer network, and
a device for insulation monitoring, wherein the poles and connection points are each switched via a voltage divider to a reference potential for insulation measuring,
characterized in that
the battery management system also has a device for checking the switching status of the controllable switching elements by means of measuring devices for determining the electrical voltage;
the measuring devices are arranged in such a way that they measure the voltage between the output of the respective voltage divider and the reference potential;
the device for checking the switching status of the controllable switching elements has a device for comparing the measured voltage values from the two measuring devices;
one controllable switching element is switched between each of their assigned voltage dividers.

Conventional battery management systems require insulation monitoring due to the voltages that occur in high-voltage systems. The particular advantage of the invention consists in that the voltage dividers present for implementing the insulation monitoring are also used for checking the switching status of the switching elements. Consequently, the large-format voltage dividers otherwise needed for checking the switching status of the switching elements are no longer necessary. This saves on component parts and the package space required for them.

Advantageously, the battery management system for a high-voltage battery will have a switching device that uses controllable switching elements to either make an electrical connection between the high-voltage battery and a consumer network to be supplied by the high-voltage battery or to disconnect the battery from the network. In regular operation, the battery management system makes sure the switching elements provide for a connection between the high-voltage battery and the consumer network. In maintenance mode, for example, a command from maintenance personnel may result in the high-voltage battery being disconnected from the consumer network, so that maintenance work can be done without applied high voltage. Likewise, if the battery management system detects critical errors, the high-voltage battery will be disconnected from the consumer network. The consumer network is switched to the poles of the high-voltage battery via connection points; a switching element is arranged between a pole of the high-voltage battery and a connection point for the consumer network; this switching element either establishes or disconnects the electrical connection between the pole of the high-voltage battery and the connection point through the battery management system. When the connection of the first switching element has been established, the voltage of the positive pole of the high-voltage battery is applied to the positive pole of the connection point. When the connection of the second switching element has been established, the voltage of the negative pole of the high-voltage battery is applied to the negative pole of the connection point.

Preferentially, the switching elements for both poles will be switched simultaneously, so that either both battery poles are connected to the connection points or both are disconnected from it.

The battery management system also has a device for insulation monitoring, wherein the poles and connection points are each switched via a voltage divider to a reference potential for insulation measuring. The poles and connection points are each connected to the input of the respective voltage divider. In some embodiments, the device for insulation monitoring has a generator and measuring circuit for insulation measurements.

The battery management system also has a device for checking the switching status of the controllable switching elements. In addition, measuring devices for determining the electrical voltage are arranged between the outputs of the voltage dividers and the common reference potential.

There is a first measuring device for measuring the voltage at the positive pole of the high-voltage battery, a second measuring device for measuring the voltage at the negative pole of the high-voltage battery, a third measuring device for measuring the voltage at the positive pole of the connection point for the consumer network and a fourth measuring device for measuring the voltage at the negative pole of the connection point for the consumer network.

The device for checking the switching status of the controllable switching elements also has a device for comparing the measured voltage values from each of the two measuring devices; one controllable switching element is switched between each of their assigned voltage dividers.

Accordingly, the voltage of the first measuring device is compared with the voltage of the third measuring device to derive the actual switching status of the first switching element. Likewise, the voltage of the second measuring device is compared with the voltage of the fourth measuring device to derive the actual switching status of the second switching element.

If the switching elements are closed, the battery voltage is also applied to the connection points. Accordingly, the first measuring device measures a voltage that essentially matches the voltage of the third measuring device. The same applies to the voltage of the second measuring device compared to the voltage of the fourth measuring device.

If the switching elements are open, there is usually no voltage applied at the connection points for the consumer network. Accordingly, the first measuring device measures a voltage that differs significantly from the voltage of the third measuring device. The same applies to the voltage of the second measuring device compared to the voltage of the fourth measuring device.

A short time after the consumer network is disconnected from the high-voltage battery, the voltage applied in the consumer network may approximately correspond to the battery voltage despite the disconnection. In this case, the switching status determined for a consumer network connected to the battery does not apply. Even if this occurs, you can expect the voltage to fade away within a short time, or the switching status will be correctly determined by suitably debouncing the results.

If the switching elements function correctly and if there is a connection between the battery poles and connection points, the voltage difference between the first and third measuring devices must essentially yield zero; likewise for the voltage difference between the second and fourth measuring devices.

Minor voltage differences are also produced when the switching elements function properly due to the voltage drop at the switching element between the two measuring devices, or due to the voltage differences resulting from the measuring tolerance of the measuring devices.

In some embodiments, the device for checking the switching status of the controllable switching elements determines that a switching element has in fact established an electrical connection between a pole and the assigned connection point if the comparison of voltages yields a voltage difference that is less than or equal to a specified threshold value.

In some embodiments, the device for checking the switching status of the controllable switching elements determines that a switching element in fact has no electrical connection between a pole and the assigned connection point if the comparison of voltages yields a voltage difference that is greater than the specified threshold value.

In some embodiments, the determined threshold value corresponds at least to the voltage drop through the internal resistance of the switching element arranged between the two measuring devices plus the voltage difference resulting from the measuring tolerance of the measuring devices. Preferentially, the threshold value for all switching elements and measuring devices are set the same. In other embodiments, the threshold value for individual voltage comparisons can be adjusted individually.

Therefore the battery management system is capable of comparing the switching request made to the switching elements with the actually determined switching status of the switching elements. In some embodiments, the battery management system signals an alarm status if the measured switching status of at least one of the switching elements does not correspond to the set switching status of the switching element. It is also possible to signal which switching element is affected by the malfunction. In some designs, the malfunction of a switching element causes the functional switching element to be disconnected from the consumer network.

Preferably, the switching elements are implemented using at least one contactor. Provision of two contactors, i.e. one per battery pole, is also preferable.

It is preferable for the measuring devices to include analog/digital converters. In some embodiments, an analog inverter is connected upstream of each of those analog/digital converters; the voltage of the inverters is negative relative to the reference potential. In some designs, that is the case for the voltage dividers at the negative pole of the high-voltage battery and the negative pole of the connection point for the consumer network.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION OF THE DRAWINGS

Figure 1:
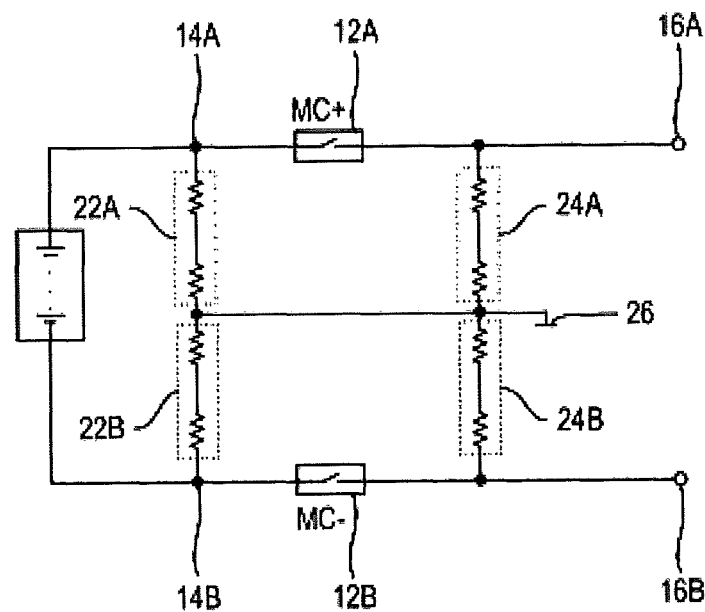
FIG. 1 is a schematic view of a voltage divider network for insulation monitoring in accordance with the state of the art.

FIG. 1 shows a schematic view of a voltage divider network for insulation monitoring in accordance with the state of the art.

The battery management system 10 makes a high-voltage battery available for a consumer network, such as a vehicle network in an electric or hybrid vehicle, via connection points 16A, 16B. In regular operation, the high-voltage battery's positive pole 14A is connected to the connection point's positive pole 16A, while the high-voltage battery's negative pole 14B is connected to the connection point's negative pole 16B. A first controllable switching element 12A of a switching device for disconnecting or connecting the battery to the connection point 16A is arranged between the high-voltage battery's positive pole 14A and the connection point's positive pole 16A. Analogously, there is a second controllable switching element 12B of a switching device for disconnecting or connecting the battery to the connection point 16B. The battery management system 10 monitors the function of the battery and disconnects the battery from the consumer network in the event of a fault or if there is an outside request, such as for maintenance.

A voltage divider network is provided for insulation monitoring of the system; it makes battery poles 14A, 14B and connection points 16A, 16B accessible for insulation measurements. The input of a first voltage divider 22A is arranged at the positive pole 14A of the high-voltage battery and switched to a reference potential 26 for insulation measurement. The input of a second voltage divider 22B is arranged at the negative pole 14B of the high-voltage battery and switched to a reference potential 26 for insulation measurement. The input of a third voltage divider 24A is arranged at the positive pole 16A of the connection point, thus after the first switching element 12A, and is switched to a reference potential 26 for insulation measurement. The input of a fourth voltage divider 24B is arranged at the negative pole 16B of the connection point, thus after the second switching element 12B, and is switched to a reference potential 26 for insulation measurement.

This circuit arrangement for insulation monitoring in a battery management system, familiar from the state of the art, is now being expanded by checking the switching status of switching elements 12A, 12B in accordance with the invention.

Figure 2:
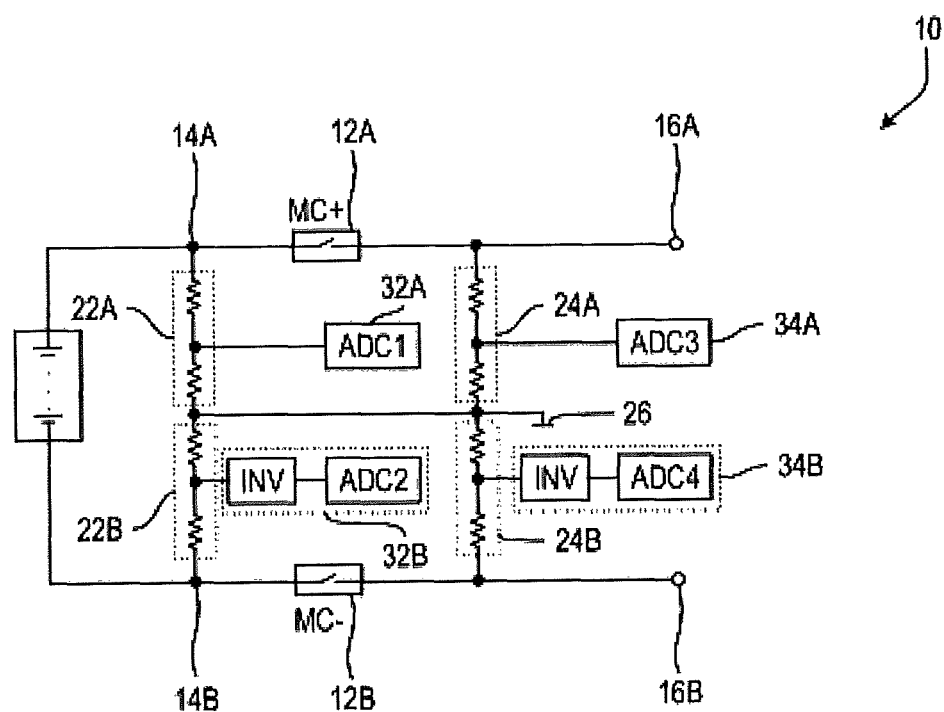
FIG. 2 is a schematic view of a battery management system according to a design example of the invention.

FIG. 2 shows a schematic view of a battery management system 10 based on a design example of the invention.

This includes the elements already familiar from FIG. 1. Moreover, measuring devices for determining the electrical voltage are arranged at the outputs of the voltage dividers, that is, at a point between the two resistors switched in series; these devices determine the voltage between the respective output of the voltage divider and the reference potential 26 for insulation measurement. The first measuring device 32A is arranged at the output of the first voltage divider 22A in the form of an analog/digital converter. The second measuring device 32B is arranged at the output of the second voltage divider 22B in the form of an analog/digital converter with an analog inverter connected upstream. The analog inverter is needed because the voltage to be measured is negative with respect to the reference potential. The third measuring device 34A is arranged at the output of the third voltage divider 24A in the form of an analog/digital converter. The fourth measuring device 34B is arranged at the output of the fourth voltage divider 24B in the form of an analog/digital converter with an analog inverter connected upstream. The analog inverter is needed because, in this case also, the voltage to be measured is negative with respect to the reference potential.

Based on the voltages measured, the battery management system 10 is capable of determining the actual switching status of the switching elements 12A, 12B.

LIST OF REFERENCE SYMBOLS

10 Battery management system
12A Controllable switching element at the positive pole of a high-voltage battery
12B Controllable switching element at the negative pole of the high-voltage battery
14A Positive pole of the high-voltage battery
14B Negative pole of the high-voltage battery
16A Positive pole of the connection point for a consumer network
16B Negative pole of the connection point for a consumer network
16B Second monitoring input
22A Voltage divider at the positive pole of the high-voltage battery
22B Voltage divider at the negative pole of the high-voltage battery
24A Voltage divider at the positive pole of the connection point for the consumer network
24B Voltage divider at the negative pole of the connection point for the consumer network
26 Reference potential for insulation measurement
32A Measuring device at the output of the voltage divider 22A
32B Measuring device at the output of the voltage divider 22A
34A Measuring device at the output of the voltage divider 24A
34B Measuring device at the output of the voltage divider 24B

The invention claimed is:

1. A battery management system for a high-voltage battery, the battery management system comprising:
a first switching device with a first controllable switching element for establishing and disconnecting an electrical connection between a positive pole of the high-voltage battery and a positive connection point for a consumer network;
a second switching device with a second controllable switching element for establishing and disconnecting an electrical connection between a negative pole of the high-voltage battery and a negative connection point for a consumer network;
a first voltage divider with an input at the positive pole of the high-voltage battery;
a second voltage divider with an input at negative pole of the high-voltage battery;
a third voltage divider with an input at the positive connection point for a consumer network;
a fourth voltage divider with an input at the negative connection point for a consumer network;
a reference potential for insulation measurement with an input from each of the first voltage divider, second voltage divider, third voltage divider, and fourth voltage divider;
a first measuring device connected to the first voltage divider;
a second measuring device connected to the second voltage divider;
a third measuring device connected to the third voltage divider;
a fourth measuring device connected to the fourth voltage;
wherein a ratio of measurements from the first measuring device and the third measuring result in approximately a first predetermined voltage ratio when the first switching device is closed; and
wherein a ratio of measurements from the second measuring device and the fourth measuring device result in approximately a second predetermined voltage ratio when the second switching device is closed.

2. The battery management system in accordance with claim 1, wherein the first and second controllable switching elements have at least one contactor.

3. The battery management system in accordance with claim 1 wherein the first and second measuring devices include analog/digital converters.

4. The battery management system in accordance with claim 1 wherein the battery management system also includes analog inverters, wherein one analog inverter is connected upstream of each of the analog/digital converters that are switched at the second and second and fourth voltage dividers at a negative pole of the high-voltage battery and an assigned connection point for the consumer network.

5. The battery management system in accordance with claim 1 wherein the measuring devices are configured to detect an established electrical connection between one pole and the assigned connection point when the comparison of voltages yields a voltage difference that is less than or equal to a specified threshold value.

6. The battery management system in accordance with claim 5 wherein the specified threshold value corresponds at least to the voltage drop caused by the internal resistance of the switching element arranged between two measuring devices plus the voltage difference resulting from the measuring tolerance of the measuring devices.

7. The battery management system in accordance with claim 1 wherein the measuring devices are configured to detect a break in the electrical connection between one pole and the assigned connection point when the comparison of voltages yields a voltage difference that is greater than a specified threshold value.

8. The battery management system in accordance with claim 1 wherein the battery management system signals an alarm status when the measured switching status of one of the switching elements does not correspond to the set switching status of that switching element.

\* \* \* \* \*